United States Patent
Tsou et al.

(10) Patent No.: US 6,265,305 B1
(45) Date of Patent: Jul. 24, 2001

(54) METHOD OF PREVENTING CORROSION OF A TITANIUM LAYER IN A SEMICONDUCTOR WAFER

(75) Inventors: Shih-Fang Tsou, Hsin-Chu Hsien; Yu-Jen Chou, Hsin-Chu; Cheng-Shun Hu, Kaoshiung, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/410,094

(22) Filed: Oct. 1, 1999

(51) Int. Cl.$^7$ ................................................ H01L 21/4763
(52) U.S. Cl. ..................... 438/628; 438/625; 438/626; 438/627; 438/648; 438/656; 438/976; 438/688
(58) Field of Search ..................................... 438/625, 626, 438/627, 628, 648, 656, 793, 976, FOR 355, 688

(56) References Cited

U.S. PATENT DOCUMENTS

| | | | |
|---|---|---|---|
| 5,093,710 | * | 3/1992 | Higuchi . |
| 5,374,591 | * | 12/1994 | Hasegawa et al. . |
| 5,470,790 | * | 11/1995 | Myers et al. . |
| 5,552,340 | * | 9/1996 | Lee et al. . |
| 5,776,831 | * | 7/1998 | Padmanabhan et al. . |
| 5,846,613 | * | 12/1998 | Neuville . |
| 6,051,281 | * | 4/2000 | Kobayashi et al. . |
| 6,063,703 | * | 5/2000 | Shinriki et al. . |
| 6,069,073 | * | 5/2000 | Kim et al. . |
| 6,083,825 | * | 7/2000 | Lin et al. . |
| 6,130,154 | * | 10/2000 | Yokoyama et al. . |
| 6,136,697 | * | 10/2000 | Wu . |

FOREIGN PATENT DOCUMENTS

| | | | |
|---|---|---|---|
| 883172 A1 | * | 6/1997 | (EP) . |
| 8288390 | * | 11/1996 | (JP) . |

\* cited by examiner

Primary Examiner—George Fourson
Assistant Examiner—Michelle Estrada
(74) Attorney, Agent, or Firm—Winston Hsu

(57) ABSTRACT

The present invention provides a method of preventing corrosion of a titanium layer in a semiconductor wafer. The semiconductor wafer comprises a dielectric layer, a column-shaped tungsten plug embedded in the dielectric layer and having its top surface cut to be at the same level as that of the dielectric layer, a titanium layer positioned on the top of the dielectric layer and covering a portion of the top surface of the tungsten plug, a main conductive layer positioned on the surface of the titanium layer, a photoresist layer positioned on the surface of the main conductive layer, and a polymer layer scattered on the surface of the semiconductor wafer. The method is first to utilize a dry cleaning process to strip off the photoresist layer and the polymer layer, then to perform a nitridizing process to make the surface of the titanium layer exposed on the surface of the semiconductor wafer generate a titanium nitride layer. Finally, a wet cleaning process is performed to entirely strip off the photoresist layer and the polymer layer remained on the surface of the semiconductor wafer. The titanium nitride layer generated on the surface of the titanium layer can effectively prevent the titanium layer from being corroded.

8 Claims, 4 Drawing Sheets

METHOD OF PREVENTING CORROSION OF A TITANIUM LAYER IN A SEMICONDUCTOR WAFER

BACKGROUND OF THE INVENTION

1. Field of the Invention

The present invention relates to a method of preventing corrosion of a titanium layer in a semiconductor wafer.

2. Description of the Prior Art

A dielectric layer is normally positioned between the MOS (Metal Oxide Semiconductor) transistor and each of the metal conducting wire in a semiconductor wafer for separating and protecting the components in the semiconductor wafer. In order to successfully connect these components in the MOS to each of the metal conducting wire so as to form a complete electronic device, a contact plug formed in the dielectric layer is necessary to be used as a conducting wire between the MOS and each corresponding metal conducting wire. Therefore, just how to upgrade the quality of process for manufacturing the contact plug and the metal wire layer has become an important subject matter in the study of the process for manufacturing the semiconductor.

Please refer to FIG. 1 and FIG. 2. FIG. 1 and FIG. 2 are the prior art's schematic diagrams of the manufacturing process of the contact plug 24 of the semiconductor wafer 10. The semiconductor wafer 10 comprises a bottom conducting layer 12 and a dielectric layer 14 positioned at the top of the bottom conducting layer 12. As shown in FIG. 1, conventional process for manufacturing the contact plug 24 is first to perform photolithography and etching processes in order to form a contact hole 16, then to deposit in sequence, on the surfaces of the semiconductor wafer 10 and the contact hole 16, a titanium layer 18, a TiN (titanium nitride) layer 20, and a conducting layer 22 composed of tungsten. Thereafter, as shown in FIG. 2, by the use of CMP(Chemical Mechanical Polishing)process to perform a surface treatment on the semiconductor wafer 10 to uniformly remove the conducting layer 22, the TiN layer 20, and the titanium layer 18 on the surface of the dielectric layer 14 in order to form a contact plug 24, and in the mean time, to cut the top of the contact plug 24 to be at the same level as that of the dielectric layer 14.

Please refer to FIG. 3 and FIG. 4. FIG. 3 and FIG. 4 are the prior art's schematic diagrams of the manufacturing process of the metal wire 40 of the semiconductor wafer 10. After completing the fabrication process of the contact plug 24, a normal metallization process continues to manufacture the metal wire 40 such that the bottom conducting layer 12 connects to the other components in the semiconductor wafer 10 through the contact plug 24 and the metal wire 40 to gradually form a complete circuit. The conventional way of fabricating the metal wire 40 is first to uniformly deposit, on the surface of the dielectric layer 14 and the top of the contact plug 24, a titanium layer 26 and a protecting layer 28 composed of TiN, it then to form in sequence, on the protecting layer 28, an aluminum conducting layer 30 and an anti-reflective coating layer 32 composed of TiN, in the mean time, to define and form the pattern of metal wire 40 by the use of the photolithography and etching processes.

As shown in FIG. 4, while fabricating the metal wire 40, misalignment of the metal wire 40 often occurs due to the limitation of the manufacturing techniques or other factors, that is to say, the patterned photoresist layer 34 used for defining the metal wire 40 is unable to completely cover right at the top of the contact plug 24 even though there is a certain tolerance range in this metal misalignment phenomenon, in other words, only a portion of the metal wire 40 covers on top of the contact plug 24.

Since only a portion of the metal wire 40 covers on top of the contact plug 24, a portion of the conducting layer 22 and titanium layer 26 will be exposed on the surface of the semiconductor wafer 10. And since the tungsten's chemical potential is higher than that of the titanium, the titanium layer 26 on the titanium-tungsten interface 38 is subject to be corroded by the photoresist stripper solution during the upcoming photoresist stripping process of the photoresist layer 34. As a result, the corrosion situation will decrease the contact area between the metal wire 40 and the contact plug 24 and increase the resistance of the contact plug 24 or increase the contact resistance between the contact plug 24 and the metal wire 40, or it will even cause a serious result of disconnection of the circuit.

SUMMARY OF THE INVENTION

Therefore, the primary objective of the present invention is to provide a method of preventing corrosion of a titanium layer in a semiconductor wafer to effectively resolve the problem that the joint interface between the metal wire and the contact plug positioned underneath is exposed to the photoresist stripper solution such that the titanium layer is subject to be corroded due to the electrochemical reaction.

DETAILED DESCRIPTION OF THE INVENTION

Figure 1:
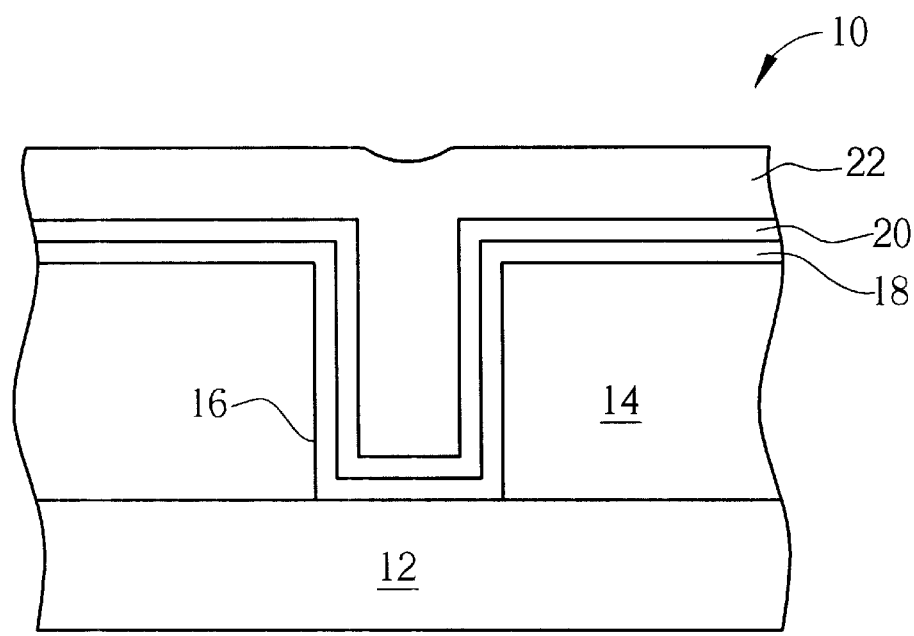
FIG. 1 and FIG. 2 are the prior art's schematic diagrams of the manufacturing process of the contact plug of the semiconductor wafer.
Figure 2:
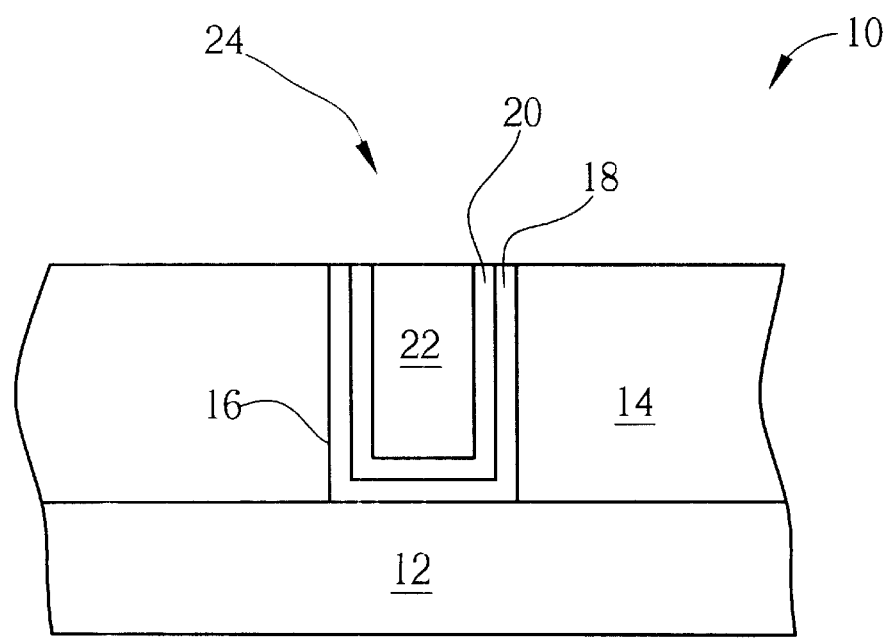
Figure 3:
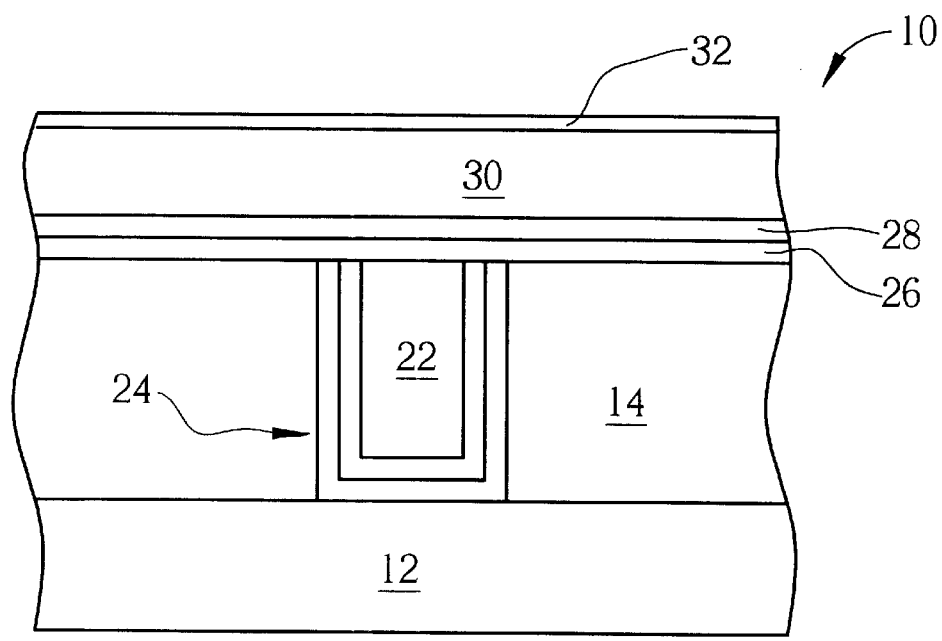
FIG. 3 and FIG. 4 are the prior art's schematic diagrams of the manufacturing process of the metal wire of the semiconductor wafer.
Figure 4:
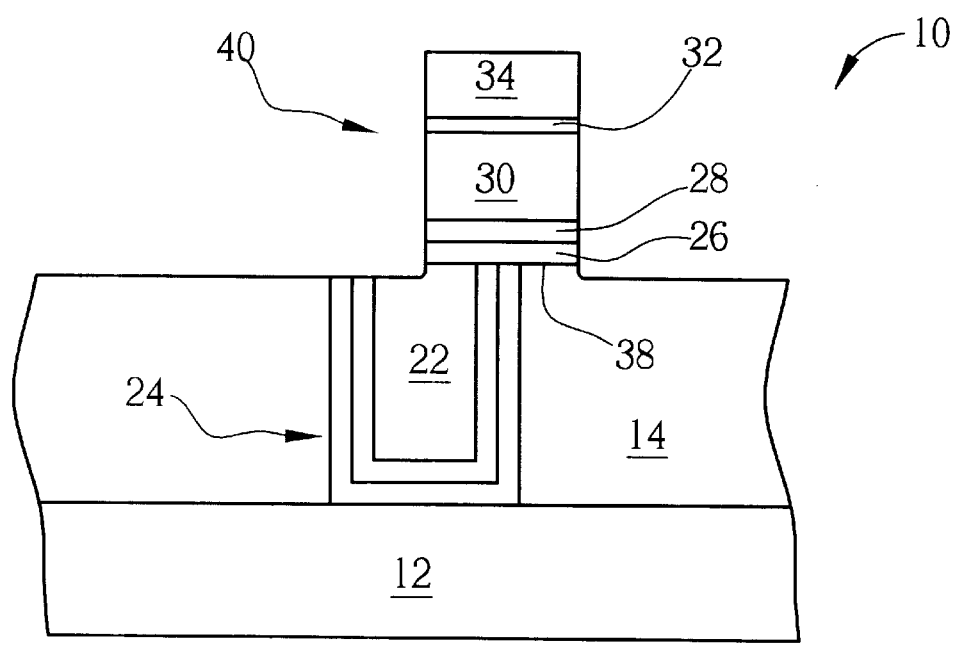
Figure 5:
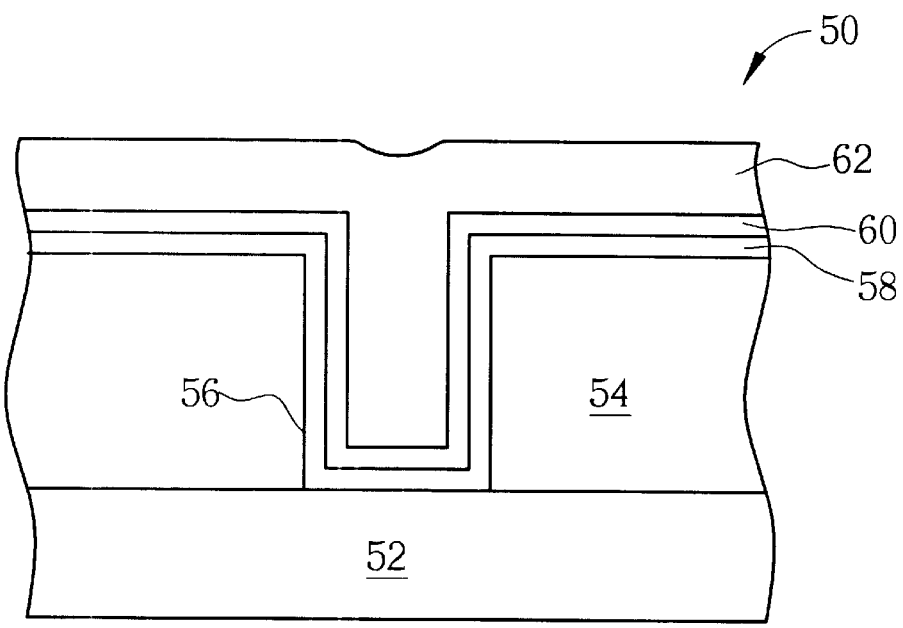
FIG. 5 to FIG. 8 are the schematic diagrams of the manufacturing process of the metal wire of the semiconductor wafer of the present invention.

Please refer to FIGS. 5 to 8. FIG. 5 to FIG. 8 are the schematic diagrams of the manufacturing process of the metal wire 76 of the semiconductor wafer 50 of the present invention. The present invention provides a method of preventing corrosion of a titanium layer in a semiconductor wafer. The method can be applied in the manufacturing process of the metal wire at the top of the contact plug. As shown in FIG. 5, the semiconductor wafer 50 comprises a bottom conducting layer 52 and a dielectric layer 54 positioned at the top of the bottom conduction layer 52. The dielectric layer 54 comprises a through hole used as a contact hole 56 (or as a via hole).

In manufacturing the metal wire, the method of the present invention is first to uniformly deposit in sequence, on the surface of the semiconductor wafer 50 and the contact hole 56, a glue layer 58 composed of titanium, a barrier layer 60 composed of TiN, and a conducting layer 62 composed of tungsten. In the upcoming manufacturing process, the barrier layer 60 can prevent titanium in the glue layer 58 from being corroded and can bar the metal ion from invading through the semiconductor components positioned underneath, thus affecting the normal operation of the semiconductor components.

Figure 6:
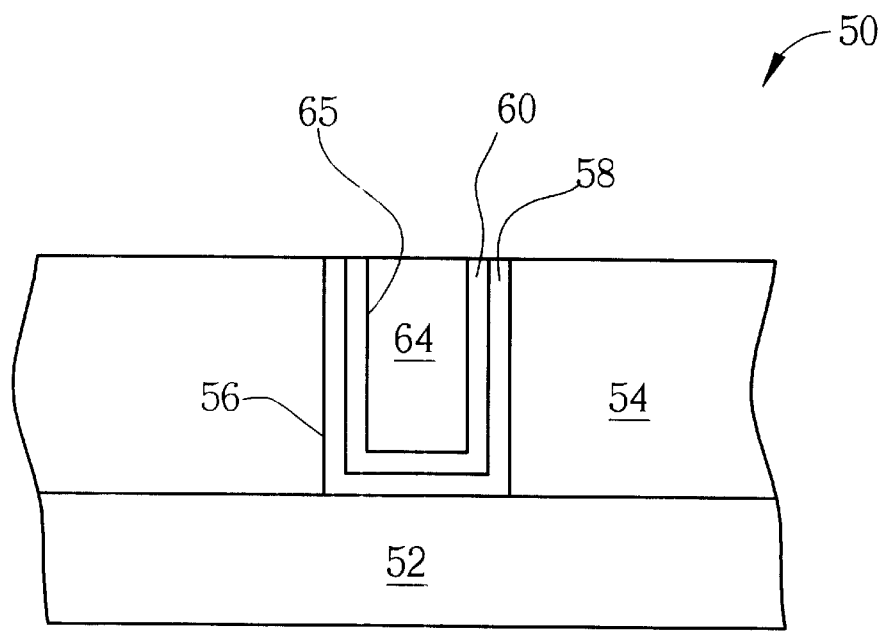

Thereafter, as shown in FIG. 6, a surface treatment is performed on the semiconductor wafer 50 by CMP method to uniformly remove the conducting layer 62, the barrier layer 60, and the glue layer 58 on the surface of the dielectric layer 54 in order to form a tungsten plug 64 and to cut the top of the tungsten plug 64 at the same level as that of the surface of the dielectric layer 54 so as to the tungsten plug 64 is a kind of column-shaped structure embedded in the dielectric layer 54 and having an annular vertical side wall 65.

Figure 7:
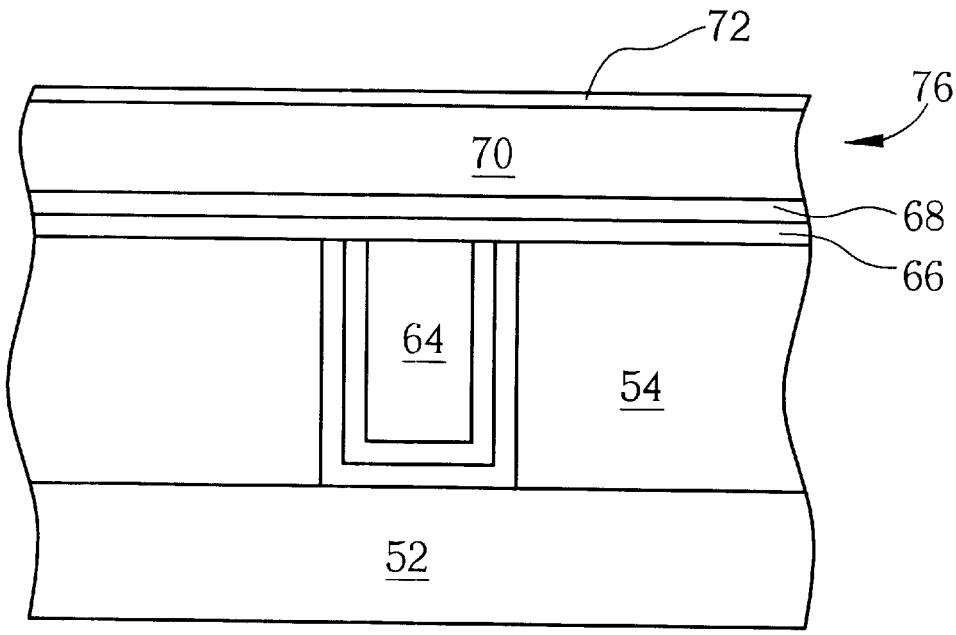

As shown in FIG. 7, after the fabrication process of the tungsten plug 64 is completed, the fabrication process of the metal wire will be continued to connect the bottom conducting layer 52 to the other components on the semiconductor wafer 50 through the tungsten plug 64 and metal wire in order to gradually form a complete circuit. The fabrication process of the metal wire is first to uniformly deposit, on the surface of dielectric layer 54 and at the top of tungsten plug 64, a titanium layer 66 and a protection layer 68 composed of TiN, then to form in sequence, on the protecting layer 68, an aluminum conducting layer 70 composed of copper-aluminum alloy and an anti-reflective coating layer 72 composed of TiN. The protecting layer 68, the aluminum conducting layer 70, and the anti-reflective coating layer 72 together form a main conducting layer 76 of the metal wire. Among them, the protecting layer 68 is used for preventing the copper-aluminum alloy in the aluminum conducting layer 70 and the titanium in the titanium layer 66 from chemical reaction. There is an alternative to cover the aluminum conducting layer 70 directly on the surface of the titanium layer 66.

Figure 8:
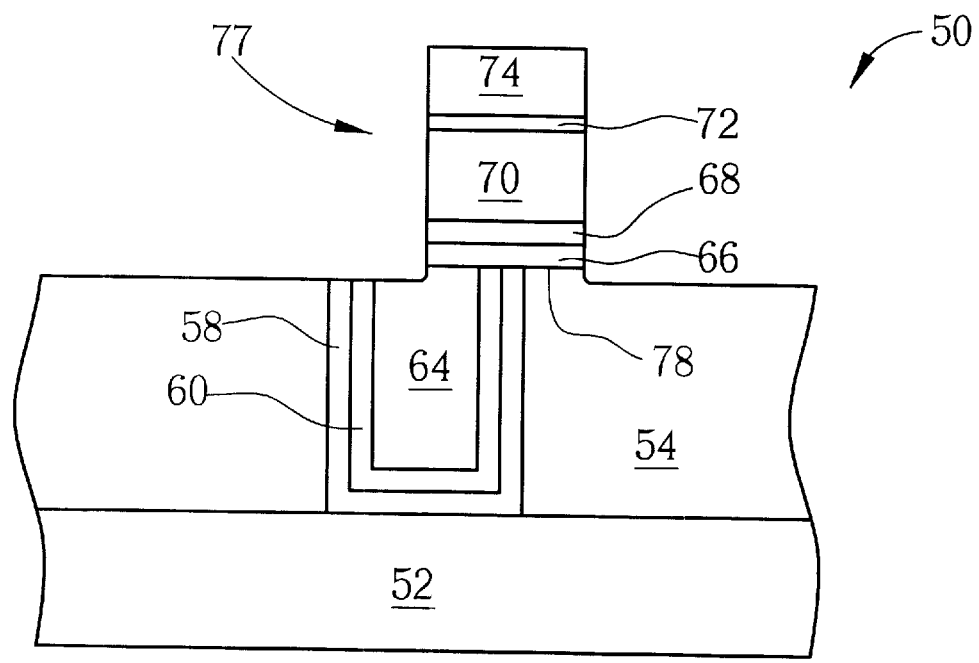

As shown in FIG. 8, thereafter, a layer of photoresist layer 74 is uniformly coated on the surface of the semi-conductor wafer 50, and then the photolithography and etching processes are used to define and form a predetermined pattern of metal wire 77. While performing the etching process for forming the metal wire 77, a lot of polymers will be generated that are scattering around and are deposited on the surface of the semiconductor wafer 50 to form a polymer layer (not shown in FIG. 8). Therefore, a dry cleaning process is then performed in a vacuum chamber of the etching process to roughly eliminate the polymer layer and the photoresist layer 74 on the surface of the semiconductor wafer 50. The dry cleaning process of the present invention is to introduce oxygen in the vacuum chamber to perform a plasma process, or to introduce carbon tetrafluoride ($CF_4$) in an environment containing oxygen to act as reacting gas, and to perform a dry cleaning process by the use of plasma.

Afterward, a nitridizing process is performed to introduce nitrogen ($N_2$), ammonia ($NH_3$) or other nitrogenous gases into the vacuum chamber to form a plasma environment containing nitrogen such that the surface of the titanium layer 66 exposed to the surface of the semiconductor wafer 50 is reacted to generate a TiN layer (not shown in FIG. 8). Finally, a wet cleaning process is performed by the use of a standard photoresist stripper solution to entirely strip off the polymer and the photoresist layer 74 remained on the surface of the semiconductor wafer 50, thus the fabrication process of metal wire 77 is completed.

By employing the method of the present invention in fabricating the metal wire 77, since the surface of the titanium layer 66 exposed to the surface of the semiconductor wafer 50 is reacted to generate first a protecting layer 68 composed of TiN by using nitrogen or ammonia before the photoresist stripper process of performing the wet cleaning, the joint interface 78 is in no way to be exposed to the surface of the semiconductor wafer 50. While in performing the photoresist stripper process, since the photoresist stripper solution is by no means to contact the titanium-tungsten joint interface 78, the electrochemical reaction between the titanium and tungsten is unable to occur in exposing in the environment of photoresist stripper solution. Thereby, the method of the present invention can prevent the titanium layer 66 at the top of the tungsten plug 64 from being corroded.

While employing the method of the present invention to fabricate tungsten plug 64 and the metal wire 77 on top of the tungsten plug 64, even though the photoresist layer 74 is unable to entirely cover right at the top of the tungsten plug 64 which results in the fact that the metal wire 77 is unable to entirely overlap to cover right at the top of the tungsten plug 64, the method of the present invention to form a TiN layer at the top of the titanium layer 66 can also prevent the titanium layer 66 from being corroded by the photoresist stripper solution. In addition, the method of the present invention can also prevent the titanium layer 66 at the top of the tungsten plug 64 from being corroded. Therefore, by employing the method of the present invention to fabricate the tungsten plug 64 and the metal wire 77 at the top of the tungsten plug 64 can increase the tolerance range of misalignment for the metal wire 74. Besides, the method of the present invention for fabricating the metal wire 77 not only can be applied in connecting the plug in the contact hole but also can be applied in connecting the plug in other holes.

In comparison to the method of metal wire's manufacturing process of the prior art, the metal wire's manufacturing process according to the present invention is first to utilize a plasma environment containing nitrogen to perform a nitridizing process in order to make the surface of the titanium layer exposed to the surface of the semiconductor wafer to generate a TiN layer. Thereafter, the wet cleaning process is performed to strip off the photoresist. Since there is a TiN layer on the titanium layer at the top of the tungsten plug, it is in no way that a electrochemical reaction occurs between the titanium and the tungsten under the environment of photoresist stripper solution. As the method of the present invention can prevent the titanium from being corroded, the integration of the contact interface between the metal wire and the plug can be kept. In addition, the range of the positioning tolerance of the metal wire can be relatively increased.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of preventing corrosion of a titanium layer in a semiconductor wafer, the semiconductor wafer comprising a dielectric layer, a column-shaped tungsten plug embedded in the dielectric layer and having its top surface cut to be at the same level as that of the surface of the dielectric layer, a patterned titanium layer positioned on the dielectric layer and covering a portion of the top surface of the tungsten plug comprising an exposed region, a main conductive layer positioned on the surface of the titanium layer, a photoresist layer positioned on the surface of the main conductive layer, and a polymer layer covered on the surface of the semiconductor wafer, the method comprising the following steps:

performing a dry cleaning process to partially remove the polymer layer and the photoresist layer;

performing a nitridizing process to form a titanium nitride layer on the exposed portion of the titanium layer; and performing a wet cleaning process with a photoresist stripper solution to fully remove the residual photoresist layer and the polymer layer from the surface of the semiconductor wafer;

wherein the titanium nitride layer is used for preventing the titanium layer from being corroded by the photoresist stripper solution.

2. The method of claim 1 wherein an O2 gas is inputted into a vacuum chamber to perform a plasma reaction in the dry cleaning process in which the polymer layer and the photoresist layer are partially removed.

3. The method of claim 1 wherein the dry cleaning process comprises $CF_4$ as one of the reactants.

4. The method of the claim 1 wherein the nitridizing process is performed in a vacuum chamber in which a nitrogen plasma is formed by inputting a nitrogen gas or an ammonia gas into the vacuum chamber.

5. The method of claim 1 wherein the main conductive layer comprises an aluminum alloy layer.

6. The method of claim 5 where the main conductive layer further comprises an anti-reflection layer positioned on the aluminum alloy layer and a protection layer positioned between the aluminum alloy layer and the titanium layer.

7. The method of claim 6 wherein the anti-reflection layer is made of titanium nitride.

8. The method of claim 1 wherein the column-shaped tungsten plug further comprises a titanium nitride layer working as a barrier layer on its outer side and a titanium layer working as a glue layer outside the barrier layer.

* * * * *